United States Patent [19]

Hill et al.

[11] Patent Number: 5,454,919
[45] Date of Patent: Oct. 3, 1995

[54] DEPOSITING DIFFERENT MATERIALS ON A SUBSTRATE

[75] Inventors: Roger Hill, Midlothian; John Nuttall, Edinburgh; Roger K. Tolfree, Wickham Bishops, all of United Kingdom

[73] Assignee: GEC-Marconi Avionics Holdings Limited, Middlesex, United Kingdom

[21] Appl. No.: 160,876

[22] Filed: Dec. 3, 1993

[30] Foreign Application Priority Data

Dec. 3, 1992 [GB] United Kingdom ............ 9225270

[51] Int. Cl.$^6$ ............................................. C23C 14/46
[52] U.S. Cl. .................. 204/192.11; 204/298.04; 204/298.07; 204/298.26; 204/298.27
[58] Field of Search ................ 204/192.11, 192.12, 204/192.26–192.29, 298.04, 298.11, 298.26, 298.27, 298.07; 427/255.2, 255.3, 419.2–419.3; 118/720–721

[56] References Cited

U.S. PATENT DOCUMENTS

| 4,604,181 | 8/1986 | Mirtich et al. | 204/298.26 |
|---|---|---|---|
| 4,793,908 | 12/1988 | Scott et al. | 204/298.26 |
| 4,851,095 | 7/1989 | Scobey et al. | 204/192.12 |
| 4,975,168 | 12/1990 | Ohno et al. | 204/192.13 |
| 5,015,353 | 5/1991 | Hubler et al. | 427/527 |
| 5,080,455 | 1/1992 | King | 359/350 |
| 5,089,104 | 2/1992 | Kanda et al. | 204/192.11 |
| 5,122,252 | 6/1992 | Latz et al. | 204/298.26 |
| 5,229,194 | 7/1993 | Lingle et al. | 428/216 |
| 5,240,583 | 8/1993 | Ahonen | 204/298.04 |
| 5,296,122 | 3/1994 | Katsube et al. | 204/298.04 |
| 5,308,461 | 5/1994 | Ahonen | 204/192.11 |

FOREIGN PATENT DOCUMENTS

| 0230652 | 8/1987 | European Pat. Off. | 204/298.26 |
|---|---|---|---|
| 0326843 | 8/1989 | European Pat. Off. | |
| 0410627 | 1/1991 | European Pat. Off. | |
| 0428358 | 5/1991 | European Pat. Off. | |
| 0429993 | 6/1991 | European Pat. Off. | |
| 63-290271 | 11/1988 | Japan | 204/298.26 |
| 63-307272 | 12/1988 | Japan | 204/298.04 |
| 953556 | 3/1964 | United Kingdom. | |
| 1372167 | 10/1974 | United Kingdom. | |
| 1465745 | 3/1977 | United Kingdom. | |
| 1544051 | 4/1979 | United Kingdom. | |
| 2020701 | 11/1979 | United Kingdom. | |
| 1604056 | 12/1981 | United Kingdom. | |

OTHER PUBLICATIONS

W. Laznovsky, "Advances in Low–Energy Ion Beam Technology", Vacuum Technology, Aug. 1975.

*Primary Examiner*—Aaron Weisstuch
*Attorney, Agent, or Firm*—Spencer, Frank & Schneider

[57] ABSTRACT

An apparatus and method for depositing multiple layer, thin optical films onto a substrate and an optical filter made thereby. The apparatus includes a vacuum chamber; moving means for moving the substrate between regions of the vacuum chamber; material depositing means within each region for depositing a film of material on the substrate; a reactive substance source for introducing a reactive substance into each region so as to react with the material as it is deposited in that region; and control means for controlling the degree of such reaction in one region relative to the other, to obtain desired stoichiometry in the deposited materials. The method includes moving the substrate between regions; depositing different materials on the substrate in respective regions; introducing a reactive substance into each region so as to react with the material as it is deposited in that region; and controlling degree of reaction in one region relative to that in another region to obtain a desired stoichiometry in the deposited materials.

16 Claims, 5 Drawing Sheets

DEPOSITING DIFFERENT MATERIALS ON A SUBSTRATE

BACKGROUND OF THE INVENTION

1. Field of the Invention

This invention relates to depositing different materials on a substrate, for example, for the purpose of making quarter wave plate optical reflectors of high quality, such as are required in the manufacture of ring laser gyroscopes.

2. Description of the Related Art

One known method for doing this is described in a paper entitled "Advances in Low-Energy Ion Beam Technology" by W. Laznovsky, published in the journal "Vacuum Technology", August 1975. The method described in that paper uses a Kaufman-type ion source which directs a beam of low energy Argon ions onto a "target" made of the substance to be deposited on a substrate. The effect is to dislodge, or sputter, particles of the target material which are then deposited on the substrate to form a thin layer. When it is desired to produce alternate layers of different materials, such as would be required when manufacturing quarter-wave plate optical reflectors or filters, it is necessary to change the targets, and the aforementioned paper envisages a system employing three such targets that can be interchanged.

A disadvantage of previously proposed systems such as that described above is that, during the interval between the deposition of each layer, the substrate can become coated by contaminants. These may be removed using ions of low energy from a secondary ion gun but that adds to the complexity of the apparatus and of its operation.

Another problem is that the environment required for deposition of one material may not be ideal for the deposition of another material. In GB Patent Specification 2,020,701B it is proposed that the pressure of the low vacuum gas inside the chamber, the gas being deliberately introduced to control the stoichiometry of the deposited material, should be altered between the processes of depositing the different materials. The need to make such adjustments adds, however, to the complexity and time required between depositing the different layers and where a large number of layers are to be deposited on a large number of substrates, the process may become very time-consuming and expensive. Experiments, using systems such as have been described, have shown them to be unreliable in that the quality of the resulting products has been inconsistent to an extent that could require a significant proportion of them to be discarded if required for use in ring laser gyroscopes as previously mentioned.

SUMMARY OF THE INVENTION

This invention provides apparatus for depositing different materials onto a substrate comprising: means for moving the substrate between regions; means for depositing the different materials on the substrate in the respective regions; means for introducing a reactive substance into each region so as to expose the material as it is deposited in that region, to the reactive substance; and means for controlling the degree of such exposure in one region relative to the other to obtain desired stoichiometry in the deposited materials.

Whilst the invention could conceivably be used in processes such as vapour-deposition of thin films, it is envisaged that it will find primary application in sputter-deposition processes.

By employing the invention, it is possible to deposit multiple layers whilst ensuring that conditions at the substrate are suitable for the deposition of each layer. Furthermore, it becomes unnecessary to shut down the equipment for the purpose of making adjustments between layer depositions and a large number of substrates can be treated in a substantially continuous process.

The deposited material can be exposed to the reactive substance in two ways.

The first is by controlling the atmosphere in the respective regions. Conveniently this control can be achieved by introducing a reactive gas into the region and by suitable arrangement of a vacuum device controlling the pressure of the reactive gas within the region.

In contrast to controlling the atmosphere in the different regions, a beam of reactive particles can be directed onto the material as it is being deposited. Preferably the means for providing such a beam comprises an ion source and the reactive particles comprise oxygen atoms or ions. The use of this method enables a greater deposition rate to be achieved since (i) a lower background pressure of reactive particles in the vicinity of the target can be maintained, thereby reducing the likelihood of the particles reacting with the target and (ii) the reactive particles being energetic will more readily react with the deposited material.

The chamber is preferably divided into the aforementioned different regions by one or more partitions. More than one partition would be required where more than two targets are used to deposit more than two different materials. Because of the very low pressures normally employed in this type of equipment, the regions do not need to be sealed from each other in the normal sense. A suitable vacuum pump connected to each region can effectively achieve a pressure differential between connected regions.

It is considered that the use of a beam of reactive particles is inventive itself and thus, according to a further aspect of the invention there is provided a method of depositing a material on a substrate comprising directing a beam of particles onto a target, thereby causing particles of target material to be emitted towards the substrate, and directing a beam of reactive particles onto the deposited material to react with the deposited material to obtain a desired stoichiometry.

The means for depositing conveniently takes the form of a separate ion beam source associated with each region and arranged so as to direct a beam of ions, preferably Argon ions, onto an associated target in that region. It may be desirable to neutralise the ions to prevent a build-up of charge on the targets and in this specification the term "ion" is to be interpreted as including such neutralised ions. There are, however, other arrangements which could be used. In one, a single ion beam is split between the regions such that, each part of the split-beam impinges on an associated target in the respective regions to dislodge from it particles which are subsequently deposited on the substrates. The splitting of the beam can be achieved using a beam-dividing device carrying a charge the same as the charge carried by the ions forming the beam.

The means for splitting the beam can be a simple mechanical partition which can serve a secondary purpose of separating the two regions maintained at different pressures for the purpose previously explained. Alternatively, or in addition, the partition may be charged so as to repel ions of the beam and to assist division thereof. In this connection, it should be noted that the means for generating the ion beam may include a charge neutralising device so as to avoid the build-up of a charge on the target which would repel the ions. With a neutralised beam, electrostatic division of the beam would be impractical and other splitting means need be employed.

The means for moving the substrate between the regions is preferably in the form of a rotating carrier, the rotation of which carries the substrates from one region to another. It is convenient to employ individual substrate holders, mounted on the carrier and a facility may be provided to rotate, or otherwise move, each holder relative to the carrier in a way so as to ensure that the material deposited on the substrates is deposited in a uniform way. A rotating movement of the carrier is not essential and in other embodiments of the invention it would be possible to arrange for some form of linear movement to move the substrates from one region to another.

The means for moving the substrate between regions preferably has the effect of moving the substrate relative to an enclosure forming part of the apparatus, but it may also be possible to move the "regions", e.g. by rotating or moving the partition.

Where a rotating carrier is used, and it is desired to operate the apparatus in a continuous process, it may be necessary to employ some form of shield or other controlling device so as to inhibit deposition of material on the substrate as required to obtain the desired proportion of different materials deposited.

One special benefit which can be derived by employing the invention is that, because it becomes so easy to deposit the different materials alternately, without the need for time-consuming change-over processes, a graded structure can be produced between layers by moving the substrate in a continuous or pulsed fashion between regions so as effectively to deposit a film of variable refractive index or of spatially changing refractive index under optimum conditions for the structure of each material.

The graded structure may consist of rapidly alternating layers. Alternatively, if the change-overs are effected very frequently, the particles of the target materials may be deposited as a mixture which is controlled so as to vary continuously between layers of the materials. Whilst this continuously varying refractive index structure is envisaged as being useful as an interface between layers of, for example, a quarter wave plate mirror, there may be other circumstances where it is useful to create a structure having a continuously varying refractive index.

The invention also provides a method of depositing different materials onto a substrate comprising: moving the substrate between regions; depositing different materials on the substrate in the respective regions; introducing a reactive substance into each region so as to expose the material as it is deposited in that region, to the reactive substance; and controlling the degree of such exposure in one region relative to the other to obtain desired stoichiometry in the deposited materials.

The invention also provides a device comprising different materials deposited according to a process as described in the immediately preceding paragraph.

BRIEF DESCRIPTION OF THE DRAWINGS

Three methods of performing the invention will now be described by way of example with reference to the accompanying drawings in which.

DESCRIPTION OF THE PREFERRED EMBODIMENT

Figure 1:
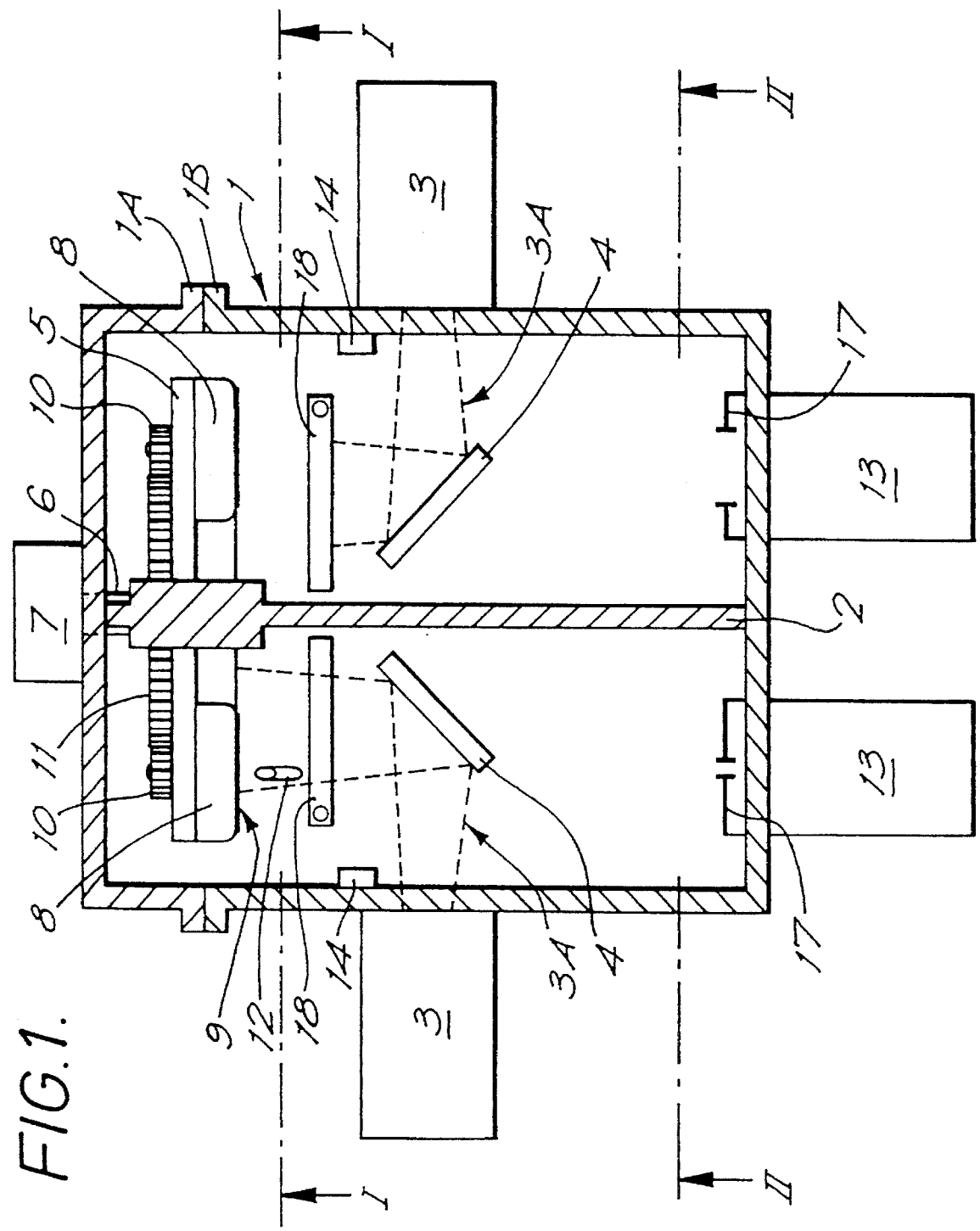
FIG. 1 is a horizontal cross-section through an apparatus constructed in accordance with the invention for depositing alternate layers of two different materials on a substrate.

Referring to FIG. 1, there is shown a chamber 1 formed of two parts, 1A and 1B.

The chamber 1 is divided by a partition 2 into two regions and associated with each region is an ion source 3.

Each ion source 3 is arranged so as to direct a beam of Argon ions, denoted 3A within the Figure and indicated as a broken line, in a manner which is well-known in the art, onto an associated target 4. Particles of the target material are dislodged by the Argon ions and are directed towards a carrier 5.

Figure 2:
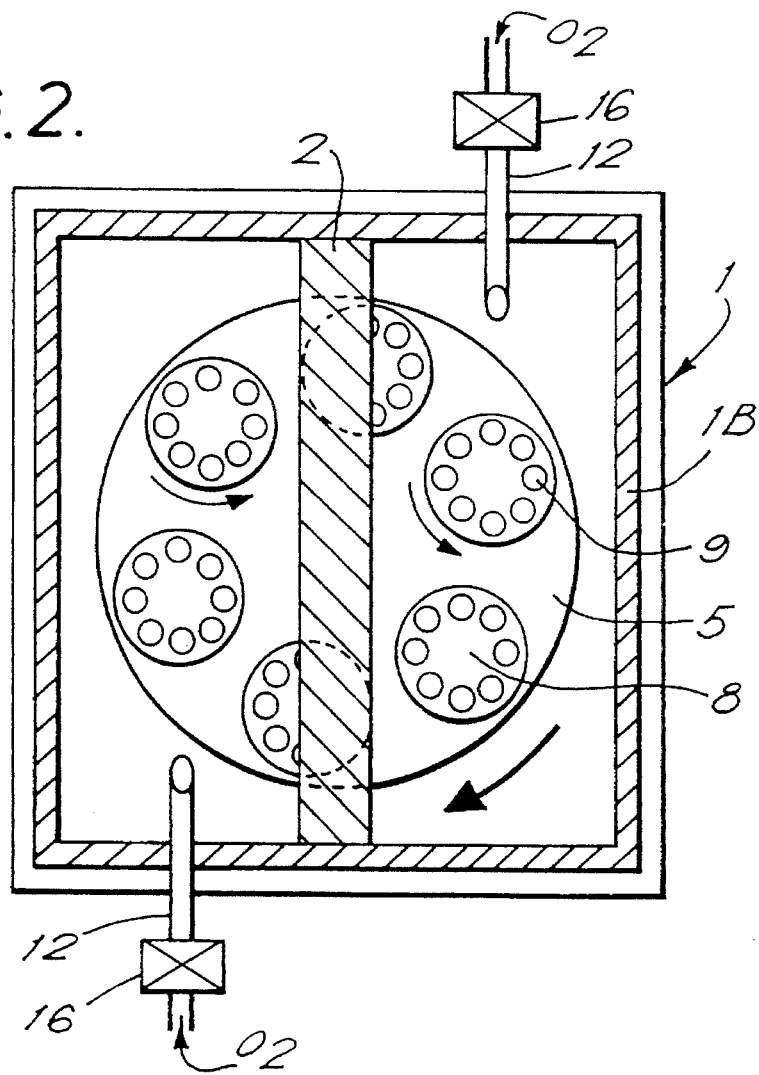
FIG. 2 is a vertical cross-section through the line I—I of FIG. 1.

The carrier 5 is mounted in a shaft 6 arranged to be driven by a motor 7. It carries a number of holders 8, each designed to hold a substrate 9 on which the layers are to be deposited by incidence of sputtered particles of the target material onto them at high energy. Each holder 8 is connected to a small sprocket 10, the teeth of which engage corresponding teeth of a large toothed wheel 11 which is fixed in relation to the walls of the chamber 1. Rotation of the carrier 5 under the action of the motor 7 causes the holders 8 to move them from one region to the other and then back again in continuous fashion so as to deposit alternate layers of the respective target material. The rotation of the carrier 5 also causes, by virtue of the engagement of the large toothed wheel 11 with the sprockets 10, the holders 8 to rotate about their axes in a planetary fashion, as indicated in FIG. 2, ensuring uniform deposition of each layer.

The two regions of the chamber are maintained with a gaseous environment appropriate to obtaining the desired stoichiometry in the different layers. In the fabrication of optical components, $SiO_2$ is often used as the low refractive index material and $TiO_2$ as the high refractive index material. To deposit these materials, targets of silicon and titanium are used respectively, with sputter-deposition taking place in the presence of an oxygen environment in which the partial pressure of the oxygen is carefully maintained. Within the embodiment shown oxygen $O_2$, or other reactive gas, is introduced through a gas inlet 12 into the respective regions. In addition, each region also has an associated pump 13 and gas pressure sensor 14. It is advantageous to use a gas pressure sensor 14 that is specific to a given gas as there may be other gases present, in particular Argon, from the ion beam source 3.

Figure 1A:
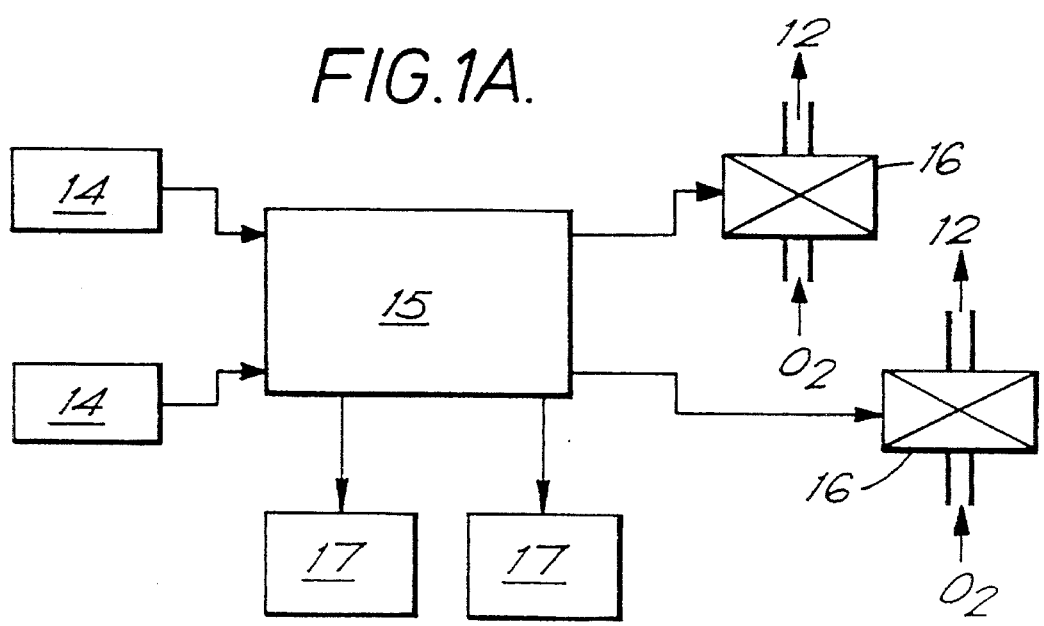
FIG. 1A is a schematic representation of the control system used to maintain the gaseous pressure within the two regions.

The partial pressure of the gaseous environment within the regions can be maintained, in response to the sensors 14 using a controller 15 within a control system as indicated in FIG. 1A. The pressure can be controlled by controller 15 in three ways: (i) by regulating the flow rate of the gas into the region through the inlet 12 by means of a valve 16, (ii) by regulating the pumping rate of pump 13, for example by throttling the pump inlet by means of an adjustable iris 17 or diaphragm and (iii) by a combination of the aforementioned techniques.

Figure 3:
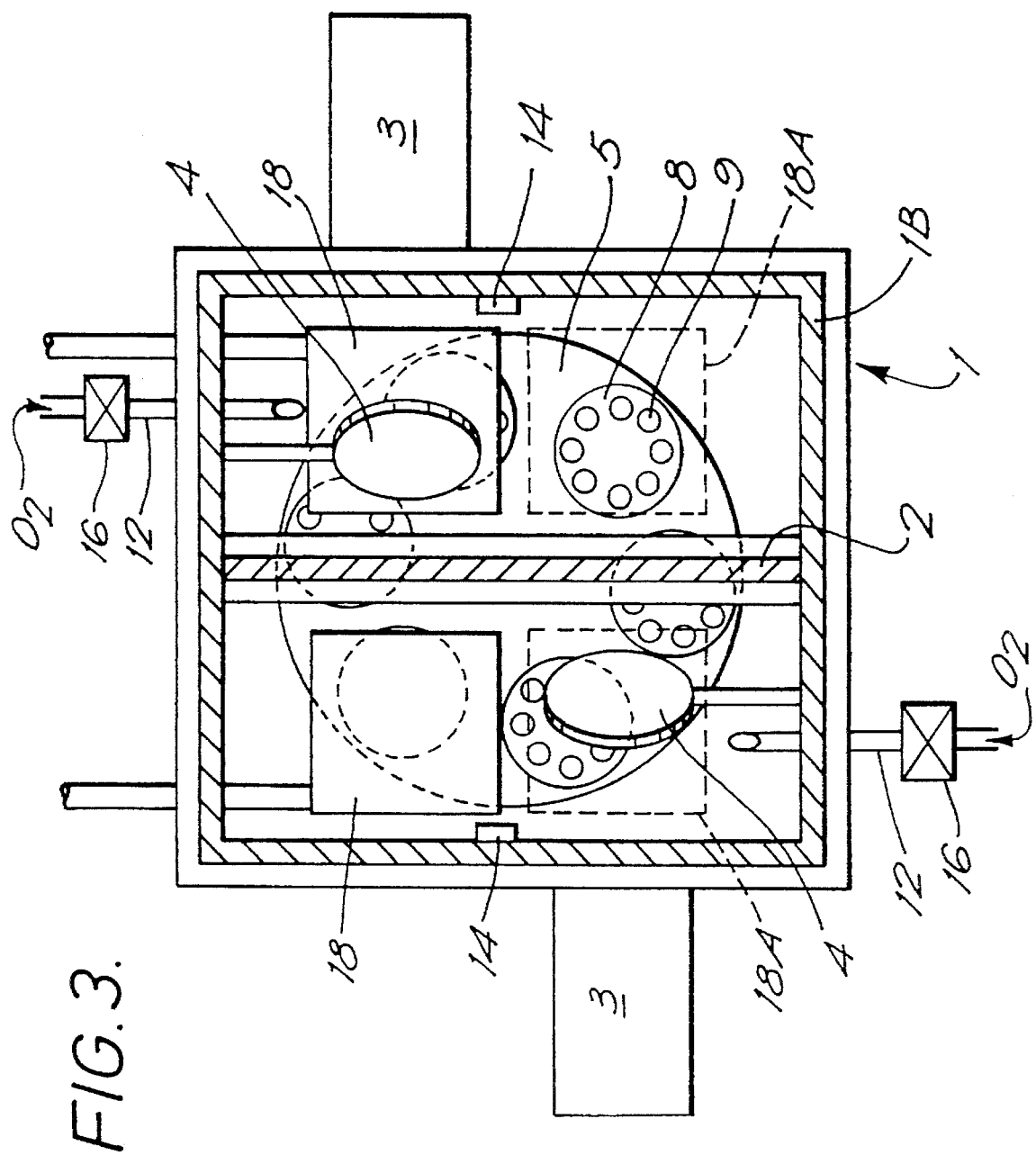
FIG. 3 is a vertical cross-section through the line II—II of FIG. 1.

It is also possible to introduce gas into one region only and use the pumps 13 to draw gas between the region, thereby establishing the desired partial pressures within the region. In such an arrangement, the regions do not need to be sealed from each other in the normal sense.

Where continuous movement of the carrier is employed, it may be desirable to suppress deposition of one or other of the target materials so as to ensure that the required thickness of each layer is obtained and for this purpose moveable shields 18 are included in the apparatus. Within FIG. 3 the moveable shield 18 is shown in a position to suppress deposition in the right-hand region and withdrawn to allow deposition within the left-hand region of chamber 1. The areas enclosed by a broken line and denoted 18A in FIG. 3 indicate the other operating position of the shields 18. The shields 18 can also be employed upon start-up of the apparatus, where it may be desirable to initially clean the targets 4 to remove contamination from their surfaces.

The deposition rate may be controlled by three means; the ion mean energy, the substrate velocity and through use of moveable shields 18. Such control ensures that it is easy to produce abrupt interfaces between layers, and hence an abrupt change of refractive index when this is required. In addition, it is also easy, when required, to produce graded refractive indices or a continuously varying refractive index between layers. For example, if a graded interface is required between layers of the materials A and B, the required thickness of material A is first deposited. Alternative layers of materials B and A are then deposited in which the thickness of layer A is progressively decreased and the thickness of layer B is progressively increased. Such a graded refractive index can only be achieved with the present invention, since alternate layers can be readily and rapidly deposited under the optimum conditions for the structure of each material. If the thicknesses of the layers in the graded structure are reduced to a sufficient extent, they become indistinguishable as layers, the particles of the different materials being effectively mixed together to form an interface of continuously varying refractive index.

In addition, whilst one film is being deposited, the ion source for the other target can be operated at a lower standby level, sufficient to maintain the target in a state of "readiness" without sputtering material from the target.

Figure 4:
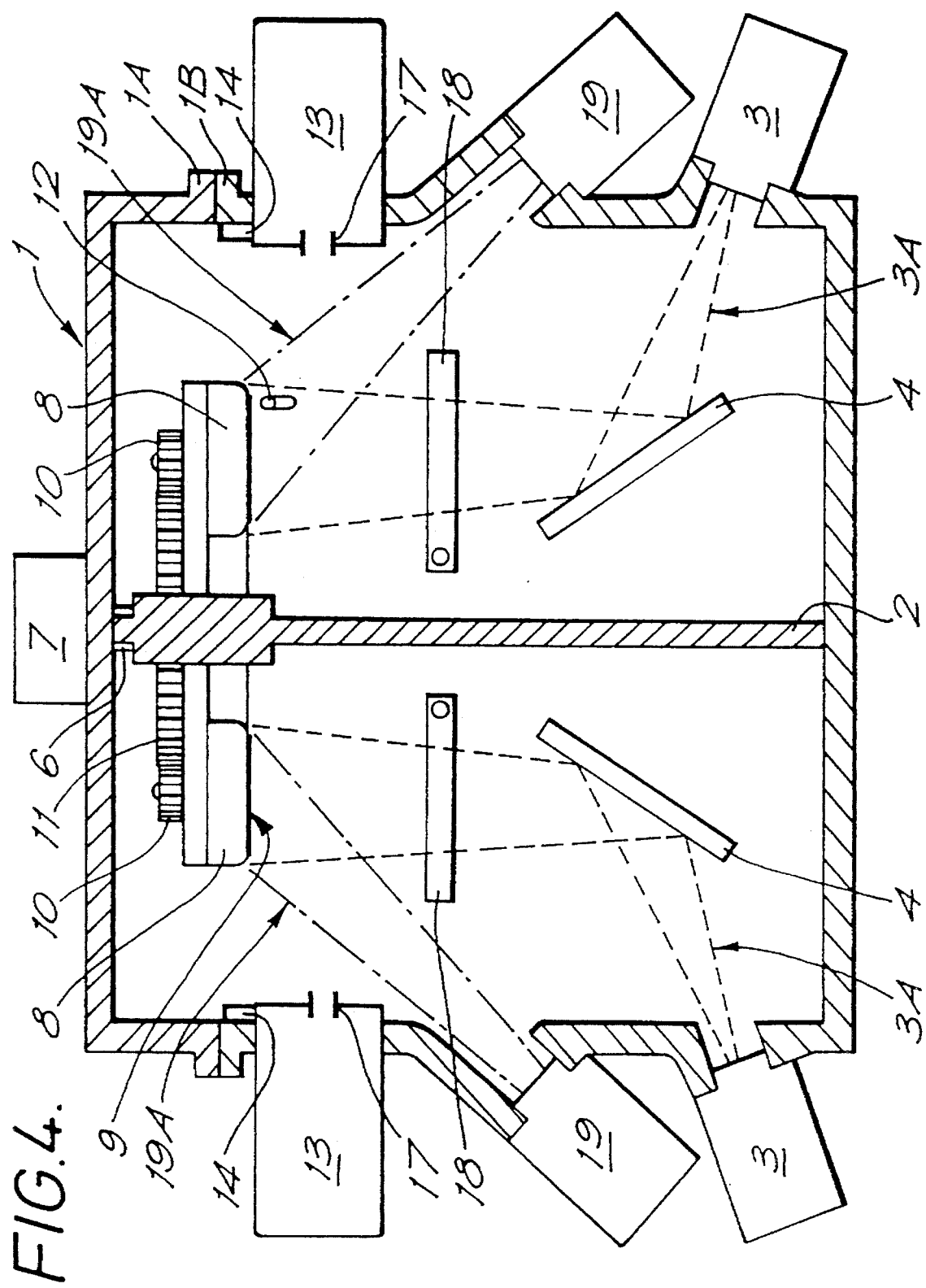
FIG. 4 is a horizontal cross-section through another apparatus constructed in accordance with the invention.

Referring to FIG. 4, a further embodiment of the invention is illustrated. A second ion source 19 in each of the regions is arranged to direct a beam 19a of oxygen $O_2$ (or other reactive material) atoms or ions onto the substrates 9 to react with the material as it is deposited and achieve the desired stoichiometry. A greater sputtering deposition rate can be achieved by providing the oxygen in this manner for two reasons, (i) a lower background pressure of oxygen in the vicinity of the target 4 can be maintained, thereby reducing the likelihood of oxidising the target, whilst ensuring there is the required condition in the vicinity of the substrate, and (ii) the atoms of oxygen are energetic and will therefore more readily react with the deposited material. Furthermore, since the energy range of the oxygen ions can be easily controlled, precise control of the stoichiometry can be achieved.

Preferably, the second ion source 19 is a radio frequency R.F. excited type as is known in the art. This type of source has a greater life expectancy, as compared to the Kaufman-type source, when it is used with reactive gases such as oxygen. The second ion source 19 can also be conveniently used to clean the substrates prior to deposition by providing the source 19 with an inert gas such as argon.

In addition to providing the reactive particle in the form of a directed beam, background gas can be introduced through inlet 12 as previously described.

Figure 5:
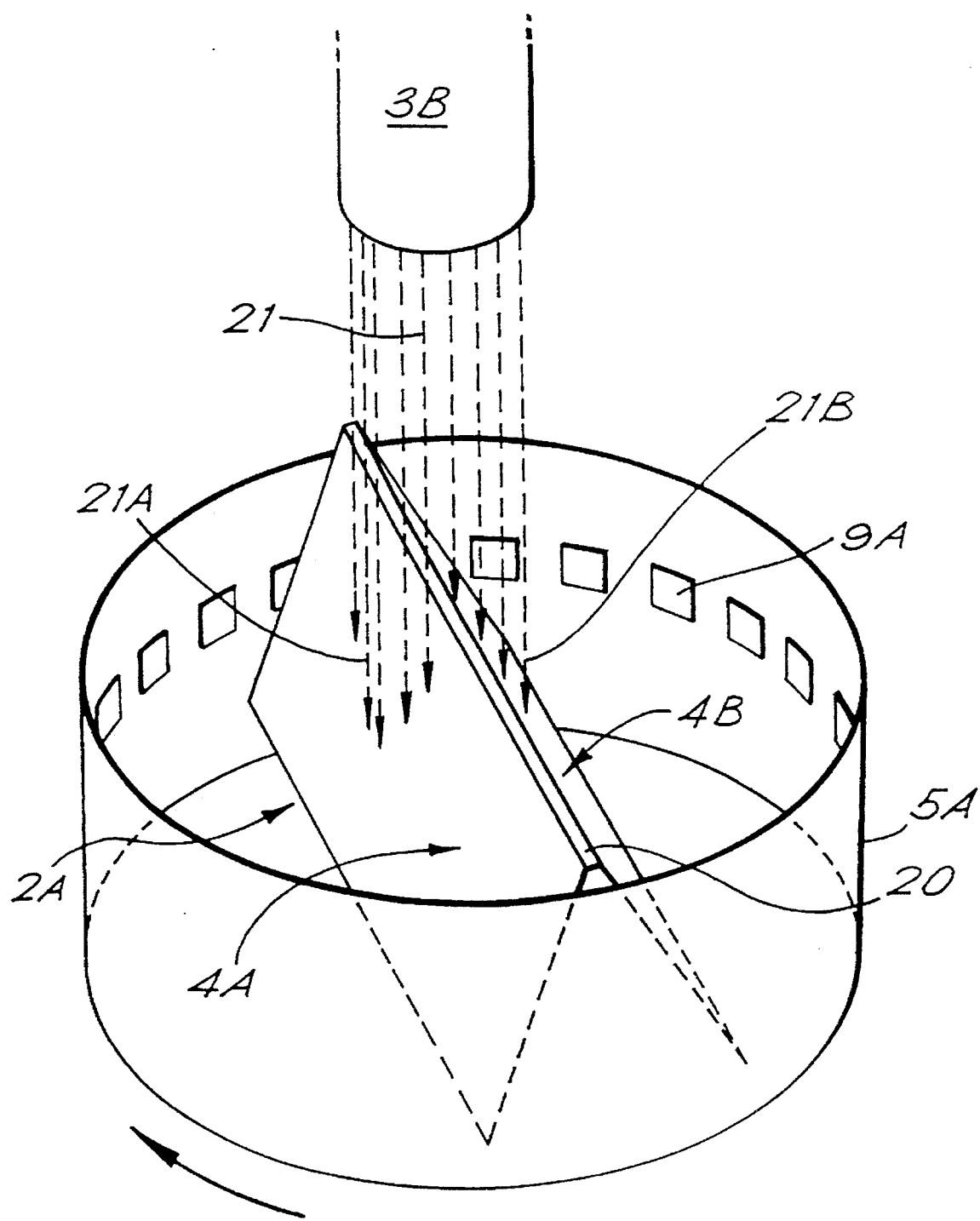
FIG. 5 is a schematic perspective view of another apparatus constructed in accordance with the invention with an outer enclosure thereof removed to reveal interior components.

It should be understood that the illustrated apparatus are only examples of how the present invention can be implemented. Although it is convenient to use two separate ion beam sources, they are expensive and other arrangements are envisaged in which a single ion beam is split between regions such that each part of the split-beam is directed to impinge on an associated target in the respective region. One such arrangement is shown schematically in FIG. 5. This is essentially similar to the previous embodiment but has a partition 2A formed by two targets 4A, 4B which are arranged to diverge from an apex as shown. This apex is defined by an edge 20. The edge 20 may be charged positively so as to assist splitting of a single beam 21 of Argon ions into two separate beams 21 A, 21B which impinge on respective targets 4A, 4B.

In this embodiment, substrates, one of which is designated by reference numeral 9A, am mounted around a cylindrical carrier 5A, which is rotated continuously so as to move the substrates between regions where the different target materials (or compounds thereof with oxygen or other gaseous material in the chamber, not shown) are deposited. A suitable facility to rotate individual substrates on the carrier may be included as may shields having similar effect to those shown at 18 in FIGS. 1,3 and 4.

The illustrated embodiments of the invention have the advantage that the use of two or more regions in which respective materials are deposited enables a faster deposition rate without the need for time consuming change over processes which could result in contamination of the deposited material. Since there is only one target material within each region the targets can be fixed and target cooling is easy to achieve. It is also a simple matter to ensure that stray ions from the ion source 3 do not impinge on the uncleaned target material. Within each region a film thickness monitor which may be used to measure the thickness of the deposited material need only be calibrated for one material.

What we claim is:

1. An apparatus for depositing multiple layer, thin optical films onto a substrate, comprising:

a vacuum chamber;

moving means for moving the substrate only within the vacuum chamber between regions of the vacuum chamber;

material depositing means for depositing a film of material on the substrate in each region, wherein the material depositing means comprises an ion beam source arranged to direct a beam of particles onto a target associated with a respective region so as to cause particles of the target to be ejected therefrom towards the substrate;

means for introducing a reactive substance into each region so as to react with the material as it is deposited in that region; and control means for controlling the degree of such reaction in one region relative to the other, to obtain desired stoichiometry in the deposited materials.

2. The apparatus according to claim 1, wherein the control means comprises means for controlling the atmosphere in the region.

3. The apparatus according to claim 2, wherein the reactive substance is a reactive gas having a gas pressure, and wherein the control means comprises means for controlling the gas pressure.

4. The apparatus according to claim 3, wherein the means for controlling the gas pressure comprises means for controlling the rate of introduction of the reactive gas.

5. The apparatus according to claim 3, wherein the means for controlling the gas pressure comprises an evacuation device for controlling the rate of gas withdrawal from the vacuum.

6. The apparatus according to claim 1, wherein the reactive substance source comprises means for directing a beam of reactive particles onto the material as it is being deposited.

7. The apparatus according to claim 1, further comprising a beam splitter to split a particle beam derived from a common ion beam source into parts such that respective parts are incident on associated targets.

8. The apparatus according to claim 1, wherein the moving means comprises a carrier which is rotatable and which moves the substrate from region to region.

9. The apparatus according to claim 1, further comprising a moveable shield arranged to suppress deposition of one of the different materials on the substrate.

10. A method of depositing multiple layer, thin optical films onto a substrate, comprising:
   a. moving the substrate only within a vacuum chamber and between regions of the vacuum chamber;
   b. depositing different materials on the substrate in different regions by directing a beam of particles, produced by or derived from an ion beam source onto a target associated with a respective region, thereby causing particles of the target to be emitted towards the substrate;
   c. introducing a reactive substance into each region so as to react with the material as it is deposited in that region; and
   d. controlling the degree of such reaction in one region relative to that in another region to obtain a desired stoichiometry in the deposited materials.

11. The method according to claim 10, wherein control of reaction is provided by controlling the atmosphere in the respective region.

12. The method according to claim 11, wherein control of the atmosphere is provided by introducing a reactive gas and controlling gas pressure thereof.

13. The method according to claim 10, wherein control of reaction is provided by directing a beam of reactive particles onto the material as the material is being deposited.

14. The method according to claim 10, further comprising splitting a single particle beam into parts which are incident on associated targets.

15. The method according to claim 10, further comprising moving the substrate between regions by positioning the substrate on a rotating carrier and rotating the rotating carrier with the substrate from region to region.

16. The method according to claim 10, further comprising suppressing deposition of at least one material by a moveable shield.

* * * * *